United States Patent [19]  
Kawamoto

[11] Patent Number: 5,012,312  
[45] Date of Patent: Apr. 30, 1991

[54] SEMICONDUCTOR INTEGRATED CIRCUIT AND A PROCESS FOR PRODUCING THE SAME

[75] Inventor: Yoshifumi Kawamoto, Kanagawa, Japan

[73] Assignee: Hitachi, Ltd., Tokyo, Japan

[21] Appl. No.: 261,843

[22] Filed: Oct. 25, 1988

[30] Foreign Application Priority Data

Nov. 2, 1987 [JP] Japan ................ 62-275819

[51] Int. Cl.⁵ .............. H01L 29/06; H01L 29/68; H01L 27/04
[52] U.S. Cl. .................. 357/23.11; 357/23.8; 357/41; 357/50
[58] Field of Search .......... 357/23.11, 50, 23.8, 357/41, 45

[56] References Cited

U.S. PATENT DOCUMENTS

| 4,385,947 | 5/1983 | Halfacre et al. | 357/23.11 |
| 4,527,325 | 7/1985 | Geipel, Jr. et al. | 357/23.11 |
| 4,562,638 | 1/1986 | Schwabe et al. | 357/23.11 |
| 4,748,489 | 5/1988 | Komatsu | 357/23.11 |
| 4,873,559 | 10/1989 | Shimizu et al. | 357/23.11 |

FOREIGN PATENT DOCUMENTS

| 60-92657 | 5/1985 | Japan | 357/23.11 |
| 60-103640 | 6/1985 | Japan | 357/50 |
| 61-156830 | 7/1986 | Japan | 357/50 |
| 63-15438 | 1/1988 | Japan | 357/50 |

Primary Examiner—Andrew J. James  
Assistant Examiner—Ngan Van Ngo  
Attorney, Agent, or Firm—Antonelli, Terry, Stout & Kraus

[57] ABSTRACT

The impurity concentration in a channel stopper in contact with a second fine active area is selected to be lower than the impurity concentration in a first active area that is wider than the second active area. This prevents the impurity concentration in the second active area from excessively rising that is caused by the diffusion of impurities when the insulating film for isolation is being formed, and helps improve characteristics and reliability of fine semiconductor device formed in the second active area.

18 Claims, 2 Drawing Sheets

SEMICONDUCTOR INTEGRATED CIRCUIT AND A PROCESS FOR PRODUCING THE SAME

BACKGROUND OF THE INVENTION

The present invention relates to a semiconductor integrated circuit and a process for producing the same. More specifically, the invention relates to a method of device isolation which is adapted to improving the controllability of the threshold voltage of fine MOS transistors and to improving the junction breakdown voltage.

A selective oxidation method called LOCO (local oxidation of silicon)or trench isolation has heretofore been used for isolating devices in the semiconductor integrated circuits. According to this method, impurities that serve as a channel stop are uniformly doped (concentrated) under a thick insulating film ($SiO_2$ film) that is formed in the isolation area. As disclosed in Japanese Patent Laid-Open No. 89940/1985, furthermore, there has been proposed the isolation of devices based on the selective oxidation by introducing impurity ions in amounts that vary depending on the sizes of isolation areas.

According to the above prior art, no attention has been given to the fact that the impurities doped in the isolation area are also diffused into the active area (area where the transistors are formed) when a thick insulating film is formed by selectively oxidizing the silicon substrate. As the active region becomes fine, furthermore, the threshold voltage of MOS transistors formed in the region becomes high, and the controllability for the threshold voltage decreases.

SUMMARY OF THE INVENTION

The object of the present invention is to provide a semiconductor device which suppresses undesired increases in the threshold voltage of MOS transistors formed in fine active areas and which has improved controllability, i.e., which has a finely controlled threshold voltage and improved reliability, as well as to provide a process for producing the same.

Another object of the present invention is to increase the breakdown voltage at the pn junction to which a high voltage is applied in the semiconductor device.

A further object of the present invention is to increase the pn-junction breakdown voltage in a circuit to which a high voltage is applied in a semiconductor device provided with a plurality of circuit groups having various functions such as a dynamic memory, non-volatile memory and operation circuit on a single semiconductor chip.

According to the present invention, the above objects are achieved by changing the doping (concentration) amount of channel stop impurities in the isolation area depending upon the devices and circuits in the semiconductor integrated circuit, or by changing the processing step of doping the impurities. The doping amount of impurities is changed by implanting ions into a desired isolation area using, as a mask, a photoresist formed by the known photo-lithography method prior to selectively oxidizing the isolation area. To change the step for doping the impurities, furthermore, the impurities should be implanted into the isolation area prior to or after the selective oxidation.

BRIEF DESCRIPTION OF THE DRAWINGS

FIGS. 1b to 1d are diagrams showing the steps for forming a semiconductor device having a plane structure shown in FIG. 1a.

DETAILED DESCRIPTION OF THE PREFERRED EMBODIMENTS

Impurity ions that serve as a channel stop, i.e. impurities employed in the formation of a channel stopper, are doped in an isolation area that surrounds a fine active area in amounts smaller than that of the impurity ions that are doped in other isolation areas, so that the impurities will not be diffused from the isolation area to the fine active area when the selective oxidation is carried out. Therefore, an undesired change to the threshold voltage of MOS transistors formed in fine active areas (the regions in which the transistors and capacitors are formed are referred to as active areas in this specification) is suppressed, and the controllability is improved for the threshold voltage. Alternatively, the impurities for forming the channel stopper are not doped in the isolation area that surrounds a fine active area before the step of selective oxidation, but are doped after the selective oxidation. Therefore, the impurities are not diffused during the selective oxidation from the isolation area into the fine active area, and the threshold voltage of the MOS transistor is controlled by the impurities doped after the selective oxidation, making it possible to greatly improve controllability for the threshold voltage.

In a semiconductor device in which a plurality of circuit groups having their own functions are formed in the same chip, furthermore, the impurity ions for effecting a channel storage doped in the isolation area that surrounds a first (second) active area in which are formed the circuit groups that use high voltages, the impurity ions for effecting a channel stop being doped in an amount smaller than that of the impurity ions doped in an isolation area that surrounds a second (first) active area in which are formed circuit groups that use low voltages, in order to increase the junction breakdown voltage of circuit groups that use high voltages. Therefore, even when the circuit groups that require high voltages and the circuit groups that require low voltages are formed on the same chip, the circuits exhibit their functions properly. In the fine active area should be formed devices having sizes smaller than those of the devices formed in large active areas.

EMBODIMENT 1

Figure 1A:
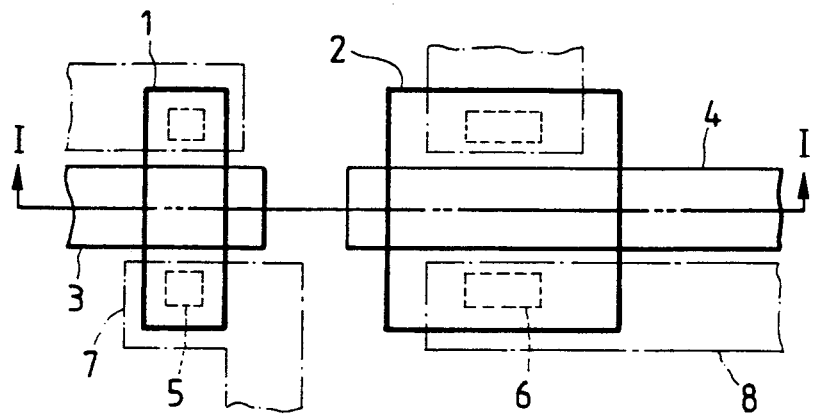
FIG. 1a is a plan view illustrating an embodiment of the present invention.

FIG. 1a is a plan view showing the layout of a portion of a semiconductor device in which MOS transistors are formed in a fine active area 1 and in a wide active area 2. In FIG. 1a, symbols 3 and 4 denote gate electrodes, 5 and 6 denote contact holes, and 7 and 8 denote patterns of wirings. An embodiment of the semiconductor device of the present invention and a process for producing the semiconductor device will now be described in conjunction with Figs. 1b to 1d which are section views along the line I-II of FIG. 1a.

Figure 1B:
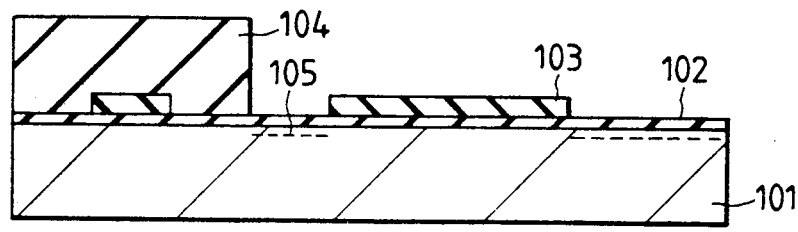

Referring, first, to FIG. 1b, an $SiO_2$ film 102 is formed maintaining a thickness of 20 nm by the thermal oxidation method on a p-type single crystalline silicon substrate 101 having a resistivity of 10 ohms.cm, and an $Si_3N_4$ film that serves as a mask for selective oxidation is formed thereon maintaining a thickness of 150 nm by the CVD method (chemical vapor deposition method).

Thereafter, the $Si_3N_4$ film formed on the isolation area is selectively removed relying upon the widely known photo-lithography method and reactive ion etching;i.e.,the $Si_3N_4$ film 103 is left on the active area only as shown in FIG. 1b. Next, as shown in FIG. 1b, a photoresist film 104 is formed maintaining a thickness of about 1 μm on the fine active area and on the surrounding isolation area by the photo-lithography method, and $B^+$ ions are implanted into the isolation area surrounding the wide active area under the conditions of an acceleration voltage of 15 kV and a dosage of $3\times10^{13}$ cm$^{-2}$ in order to dope the silicon substrate 101 with impurities 105 for forming a channel stopper.

Figure 1C:
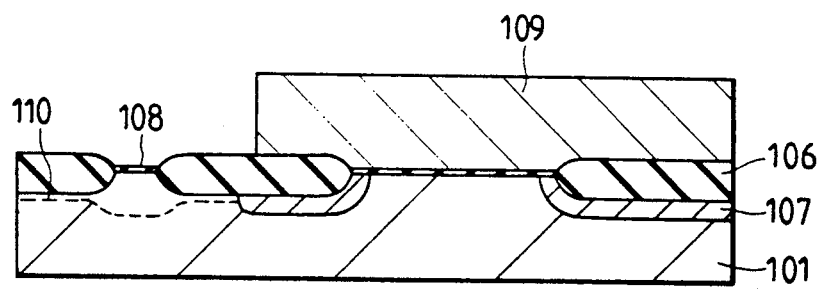

Next, the photoresist film 104 is removed, and the heat treatment is effected using the $Si_3N_4$ film 103 as a mask to grow an $SiO_2$ film 106 maintaining a thickness of 500 nm on the isolation area by the widely known wet oxidation method. In this case, the impurities 105 for forming the channel stopper are diffused in the silicon substrate 101, and are electrically activated thereby to form a channel stop layer 107 as shown in FIG. 1c. The concentration of p-type impurities in this layer is about $1\times10^{17}$ cm$^{-3}$ in average, which is greater by about several hundred times than the concentration in the silicon substrate. Next, the $Si_3N_4$ film 103 left on the active area is removed by using a hot phosphoric acid solution and, then, the $SiO_2$ film 102 is removed by using an HF aqueous solution. Thereafter, the heat treatment is effected to form an $SiO_2$ film 108 maintaining a thickness of 25 nm on the active region by the widely known dry oxidation method. With reference to FIG. 1c, a pattern consisting of a photoresist film 109 of a thickness of about 2 μm is formed on the wide active area and on the surrounding isolation area by the photo-lithography method, and $B^+$ ions are implanted as impurities 110 into the fine active area and to the surrounding isolation area to form a channel stopper under the conditions of an acceleration voltage of 200 kV and a dosage of $5\times10^{12}$ cm$^{-2}$.

Next, using the HF aqueous solution, the $SiO_2$ film 108 is removed, and an $SiO_2$ film 111 that serves as a gate insulating film for the MOS transistor is grown maintaining a thickness of 15 nm on the active region by the dry oxidation method. In this case, the channel stop impurities 110 are diffused in the silicon substrate 101 and are electrically activated thereby to form a channel stopper layer 112. The average concentration of p-type impurities in the layer 112 is about $1\times10^{17}$ cm$^{-3}$. The channel stopper layer 112 is also formed in the silicon substrate 101 in the fine active area, and the concentration in this layer becomes a maximum at a position which is about 0.5 μm deep from the surface of the silicon substrate 101 in the active area. Therefore, the concentration of p-type impurities is about $1\times10^{16}$ cm$^{-3}$ in the surface of the silicon substrate in the active area, and the threshold voltage of the MOS transistor is little affected. Here, when $B^+$ ions are implanted into the whole surface of the isolation area maintaining a dosage of $3\times10^{13}$ cm$^{-2}$ followed by selective oxidation in accordance with a traditional manner, the concentration of p-type impurities becomes about $10^{17}$ cm$^{-3}$ in the surface of the silicon substrate in the fine active area, and the threshold voltage of the MOS transistor formed in the area rises to lose the controllability. Such a problem, however, does not develop in the embodiment of the present invention.

Next, in order to control the threshold voltage of the MOS transistor, $B^+$ ions are implanted into the active area under the conditions of an acceleration voltage of 10 kV and a dosage of $1\times10^{12}$ cm$^{-2}$. In this embodiment, the ions are implanted into the whole surface of the chip. However, it is also allowable to implant the ions in small amounts into the fine active area, or not to implant the ions but to implant the aforementioned channel stop impurities in order to control the threshold voltage. When the above ions are implanted, the concentration of p-type impurities becomes about $5\times10^{16}$ cm$^{-3}$ on the surface of the active area.

Figure 1D:
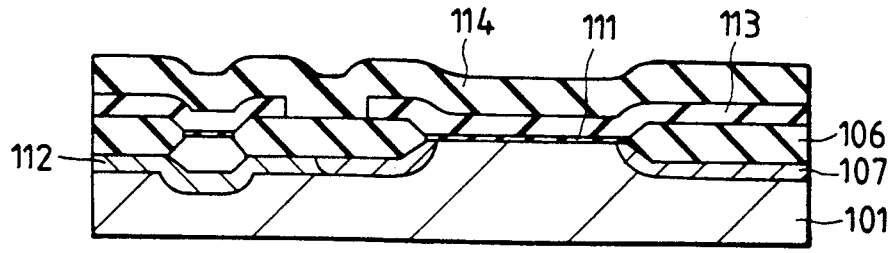

Next, referring to FIG. 1(d), a polycrystalline silicon film 113 is formed to constitute a gate electrode according to widely known steps for fabricating the semiconductor devices, $As^+$ ions are implanted into the source and drain regions, a PSG (phosphosilicate glass) film 114 is deposited on the whole surface of the chip as a first passivation film, contact holes are formed, and a wiring composed of an aluminum alloy is formed to obtain a semiconductor device. According to the semiconductor device of this embodiment, the threshold voltage is 0.8 V when the channel width of the MOS transistor formed in the wide active area is, for example, 5 μm. Furthermore, the threshold voltage ranges from 0.9 to 1.0 V even when the channel width of the MOS transistor formed in the fine active area is, for example, 0.8 to 0.6 μm. Namely, the threshold voltage changes very little even when the channel width is shortened. When the conventional method is employed in which the channel stopper impurities are uniformly doped in the whole surface of the chip and the devices are isolated by the selective oxidation, the threshold voltage becomes about 1.5 to 4 V when the channel width is 0.8 to 0.6 μm, and further increases strikingly as the channel width becomes reduced even more so. According to the present invention as described above, the threshold voltage of the MOS transistor formed in the fine active area is prevented from rising, and controllability is improved. This enables the semiconductor integrated circuit to operate at increased speeds and provides increased margin for the operation voltage of the power source.

It need not be pointed out that the dosage of channel stop impurities between the first neighboring two fine active areas is smaller than the dosage of channel stop impurities between the second two wide active areas.

EMBODIMENT 2

Figure 2:
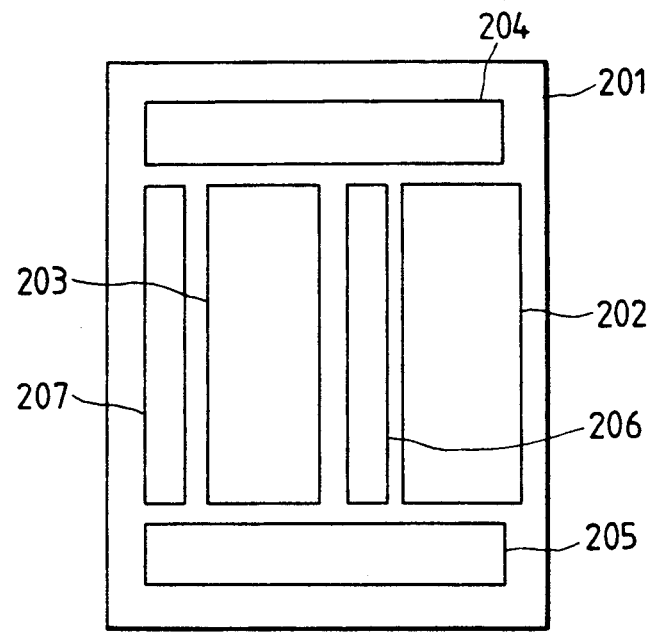
FIGS. 2 and 3 are diagrams showing arrangements on a plane according to different embodiments.

A second embodiment will now be explained in conjunction with FIG. 2 which is a plan view of a chip of a dynamic random access memory showing the positions of the circuits on the chip in a memory. On the semiconductor chip 201 are arranged memory array areas 202 and 203 in which memory cells are arranged, as well as peripheral circuit areas 204, 205, 206 and 207 in which are arranged voltage and pulse generating circuits, signal voltage amplifier circuits, and like circuits. In the above memory device, each memory cell consists of a single MOS transistor and a single capacitor. The channel width of the MOS transistor is 0.8 μm which is associated with an active area which is the smallest size in the chip. Further, the size of the active area is 0.8 μm which is the smallest size in the memory array.

In fabricating the semiconductor memory, an $SiO_2$ film is formed by the selective oxidation on the isolation area using the $Si_3N_4$ film as a mask in the same manner as in the embodiment 1. In this embodiment, however, the $Si_3N_4$ film is formed on the silicon substrate via a thin SiO₂ film unlike that of the embodiment 1, the Si₃N₄ film on the isolation area is removed by selective etching, and B⁺ ions are implanted into the whole surface of the isolation area in the p-type well region formed by introducing p-type impurities into the silicon substrate, under the conditions of an acceleration voltage of 15 kV and a dosage of $1.5 \times 10^{13}$ cm$^{-2}$. Next, using the Si₃N₄ film as a mask, the silicon substrate in the isolation area is selectively oxidized to form an SiO₂ film. Then, the Si₃N₄ film is removed in the same manner as in the embodiment 1. After the SiO₂ film formed on the active area is removed, an SiO₂ film is formed again maintaining a thickness of 25 nm on the active area. Thereafter, a 2-μm thick resist pattern is formed by photoetching, which has openings in the memory array areas 202, 203 and in those portions of the peripheral circuit areas where the device isolation size is small. Using the resist pattern as a mask, the B⁺ ions are implanted under the conditions of an acceleration voltage of 200 kV and a surface density of $5 \times 10^{12}$ cm$^{-2}$. Thereafter, the memory device is fabricated in the same manner as in the embodiment 1 according to the ordinary steps for fabricating the semiconductor.

In the memory device formed as described above, the threshold voltage of the MOS transistor having a narrow channel width constituting a memory cell can be controlled to lie over a range which is as low as 0.8 to 1.0 V. On the other hand, when the memory device is fabricated by implanting ions onto the whole surface of the p-type well region maintaining a dosage of $3 \times 10^{13}$ cm$^{-2}$, the threshold voltage becomes about 1.2 to 2 V, which is very much higher than that of the present invention. According to the present invention, therefore, the margin for the power source voltage for operating the memory can be expanded by about 0.5 V. Furthermore, the leakage current of the pn junction formed between the p-type well and the n-type high concentration diffusion layer connected to the capacitor that constitutes a memory cell can be decreased by increasing the concentration of the p-type impurities in the surface of the silicon substrate in the isolation area. This is attributed to the fact that the depletion layer of the pn junction is decreased in length at the interface between the silicon substrate and the SiO₂ film for isolation. As a result, the time for holding the data of the memory can be lengthened. The data-holding time can be further lengthened by increasing the amount of ion implantation to, for example, $7 \times 10^{12}$ cm$^{-2}$ which is greater than $5 \times 10^{12}$ cm$^{-2}$ of this embodiment to increase the concentration of p-type impurities in the isolation area in the memory array area. In this embodiment furthermore, the breakdown voltage is 13 V at the pn junction in the memory array in which the B⁺ ions are implanted at a dosage of $5 \times 10^{12}$ cm$^{-2}$ and a portion of the peripheral circuit. The breakdown voltage, however, is as high as 20 V in the peripheral circuits to which high voltages are applied; i.e., a breakdown voltage is obtained which is large enough for stably operating the circuit.

EMBODIMENT 3

Figure 3:
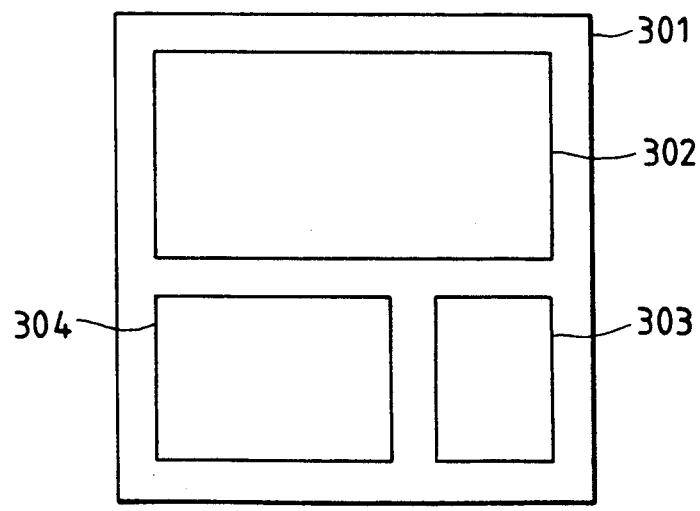

FIG. 3 is a plan view of a semiconductor device in which a non-volatile memory circuit 302, a static random access memory (SRAM) circuit 303 and a logic circuit 304 are integrated on a semiconductor chip 301.

In fabricating the semiconductor device, an SiO₂ film is formed by the selective oxidation using the Si₃N₄ film as a mask in the same manner as in the embodiment 1. In this embodiment, however, the Si₃N₄ film is formed on the silicon substrate via an SiO₂ film, the Si₃N₄ film on the isolation area is removed by selective etching, and the B⁺ ions are implanted into the area of non-volatile memory circuit 302 maintaining a dosage of $1.5 \times 10^{13}$ cm$^{-2}$, and into the areas of static random access memory circuit 303 and logic circuit 304 maintaining a surface density of $5 \times 10^{13}$ cm$^{-2}$ in the p-type well region. Thereafter, the SiO₂ film is formed on the isolation area by the widely known selective oxidation to isolate the elements. Then, non-volatile memory, static random access memory and logic circuit are formed on these regions according to the customary steps for fabricating the semiconductor devices.

The SRAM circuit 303 and the logic circuit 304 operate on 5 V, while the breakdown voltage at the pn junction is 12 to 13 V providing a sufficient margin in the operation voltage. A voltage of 12 V is necessary for operating the non-volatile memory circuit. According to this embodiment, however, the breakdown voltage is 20 V at the pn junction which is large enough for operating the circuit.

According to the present invention as described above, the amount of implanting of the channel stopper impurity ions into the isolation area of the semiconductor device formed on a semiconductor chip and the step of implantation, are varied depending upon the areas in the chip that includes devices having their respective functions in order to improve controllability for the threshold voltage of MOS transistor, to decrease the leakage current at the pn junction, and to improve breakdown voltage. Therefore, the semiconductor device can be integrated highly densely, and a circuit having a plurality of functions can be easily realized in the form of a single chip.

What is claimed is:

1. A semiconductor integrated circuit device comprising:
  a first active area in a principal surface region of a semiconductor substrate of a predetermined conductivity type including at least one first MOS semiconductor device, said first MOS semiconductor device having a channel region of a first dimensional width;
  a second active area adjacent to said first active area, in said principal surface region of said semiconductor substrate, including at least one second MOS semiconductor device formed therein, said second MOS semiconductor device having a channel region of a second dimensional width narrower than said first dimensional width;
  an isolation area formed on said semiconductor substrate between at least said first and second MOS semiconductor devices which are adjacently disposed;
  an insulating film formed in said isolation area, wherein said insulating film has formed first and second sidewalls on opposing sides thereof, said first sidewall contacting the channel region of said first MOS semiconductor device and said second sidewall contacting the channel region of said second MOS semiconductor device thereby effecting isolation therebetween; and
  first and second channel stoppers, formed in said principal surface region of said semiconductor substrate, including first and second semiconductor regions, respectively, of the same conductivity type as that of said semiconductor substrate and both being disposed so as to be in contact with and at least underlie different portions of a lower surface of said insulating film so that said insulating film lower surface is substantially completely covered thereby, wherein said first channel stopper underlies said insulating film and extends along said first sidewall of said insulating film, in contact therewith, so as to effect an impurity concentration by that part of said channel stopper on the sidewall which is greater than the concentration of impurities effected with respect to said second channel stopper in the channel region on said second sidewall of said insulating film.

2. A semiconductor integrated circuit device according to claim 1, wherein said first active area and said second active area are comprised of at least one first MOS transistor and at least one second MOS transistor, respectively.

3. A semiconductor integrated circuit device according to claim 2, wherein said first semiconductor region corresponding to said first channel stopper is disposed so that it extends along sidewalls of said insulating film in adjacent isolation areas and which sidewalls are disposed on opposing ends of the channel region thereof and having a separation corresponding to the dimensional width of the channel region of said first MOS transistor, and wherein said second semiconductor region corresponding to said second channel stopper has a portion beneath the channel region thereof which extends deeper into said semiconductor substrate than the portion thereof underlying said insulating film, thereby effecting a junction breakdown voltage of said first MOS transistor which is greater than that of said second MOS transistor.

4. A semiconductor integrated circuit device according to claim 3, wherein said at least one second MOS transistor is comprised of MOS transistors in a memory array area of a memory chip and said at least one first MOS transistor is comprised of MOS transistors for peripheral circuitry areas of a memory chip.

5. A semiconductor integrated circuit device according to claim 4, wherein in each instance of a first MOS transistor and an adjacently occurring second MOS transistor, there is disposed a channel stopper structural relationship as that between said first and channel stoppers, thereby allowing all of said first MOS transistors to have a junction breakdown voltage greater than that of said second MOS transistor.

6. A semiconductor integrated circuit device according to claim 5, wherein an active area associated with a first MOS transistor is greater than that of a second MOS transistor.

7. A semiconductor integrated circuit device according to claim 5, wherein each first MOS transistor has a channel region width-to-length dimensional ratio which is greater than that of said second MOS transistors.

8. A semiconductor integrated circuit device according to claim 7, wherein the dimensional lengths of said first and second MOS transistors are substantially the same.

9. A semiconductor integrated circuit device according to claim 8, wherein said first conductivity type is a p-type.

10. A semiconductor integrated circuit device according to claim 2, wherein an active area associated with a first MOS transistor is greater than that of a second MOS transistor.

11. A semiconductor integrated circuit device according to claim 10, wherein each first MOS transistor has a channel region width-to-length dimensional ratio which is greater than that of said second MOS transistors.

12. A semiconductor integrated circuit device according to claim 11, wherein the dimensional lengths of said first and second MOS transistors are substantially the same.

13. A semiconductor integrated circuit device according to claim 12, wherein said first conductivity type is a p-type.

14. A semiconductor integrated circuit device according to claim 1, wherein said first conductivity type is a p-type.

15. A semiconductor integrated circuit device according to claim 1, wherein said first semiconductor region corresponding to said first channel stopper is disposed so that it extends along sidewalls of said insulting film disposed on opposing sides of the corresponding channel region dimensional width of said first MOS semiconductor device, and wherein said second semiconductor region corresponding to said second channel stopper has a portion beneath the channel region of said second MOS semiconductor device which extends deeper into said semiconductor substrate than the portion thereof underlying said insulating film, thereby effecting a junction breakdown voltage of said first MOS semiconductor device which is greater than that of said second MOS semiconductor device.

16. A semiconductor integrated circuit device according to claim 15, wherein the dimensional lengths of said first and second MOS semiconductor devices are substantially the same.

17. A semiconductor integrated circuit device according to claim 16, wherein said first conductivity type is a p-type.

18. A semiconductor integrated circuit device according to claim 17, wherein said first and second channel stoppers have an impurity concentration greater than that of said semiconductor substrate.

* * * * *